United States Patent

Redman-White et al.

[11] Patent Number: 6,104,330
[45] Date of Patent: Aug. 15, 2000

[54] DIGITAL TO ANALOGUE AND ANALOGUE TO DIGITAL CONVERTERS

[75] Inventors: William Redman-White, West Wellow, United Kingdom; Mark Bracey, Sunnyvale, Calif.

[73] Assignee: U.S. Philips Corporation, New York, N.Y.

[21] Appl. No.: 09/083,697

[22] Filed: May 21, 1998

[30] Foreign Application Priority Data

May 24, 1997 [GB] United Kingdom ............. 9710658

[51] Int. Cl.$^7$ ............................................. H03M 1/80
[52] U.S. Cl. ........................................................ 341/150
[58] Field of Search ............................... 341/150, 121, 341/118, 120, 144

[56] References Cited

U.S. PATENT DOCUMENTS 4,947,169  8/1990  Smith et al. ............................ 341/121
5,400,273  3/1995  Hughes et al. ........................... 365/45
5,463,394  10/1995  Sun ........................................ 341/136

FOREIGN PATENT DOCUMENTS

0511858A2  11/1992  European Pat. Off. .
0608936A2  8/1994  European Pat. Off. .

*Primary Examiner*—Brian Young
*Attorney, Agent, or Firm*—Brian J. Wieghaus

[57] ABSTRACT

A digital to analogue converter comprises a plurality of current sources ($T_o$–$T_n$) and corresponding selection switches ($D_o$–$D_n$) which connect the current sources to an output (3). In order to enable a constant capacitance to be presented at the output (3) regardless of the input digital code a plurality of dummy current sources ($\bar{T}_o$–$\bar{T}_n$) which take the same form as the current sources ($T_o$–$T_n$) are provided. The dummy current sources have associated selection switches ($\bar{D}_o$–$\bar{D}_n$) which are operated by the logical inverse of the code applied to the current sources ($T_o$–$T_n$).

8 Claims, 3 Drawing Sheets

DIGITAL TO ANALOGUE AND ANALOGUE TO DIGITAL CONVERTERS

BACKGROUND OF THE INVENTION

The invention relates to a digital to analogue converter. The invention further relates to an analogue to digital converter. The invention has particular, though not exclusive, application in sigma delta converters.

In a sigma delta analogue to digital (A/D) converter there is a requirement for a digital to analogue (D/A) converter to complete the feedback loop. It is known that the linearity performance of this D/A converter determines the overall linearity of the whole system. In many systems the quantisation is made of 1- bit precision which avoids any possibility of linearity problems, since the transfer function should be ideal.

In a sigma delta A/D converter with multibit quantisation the issue of linearity assumes major importance. Clearly the elements which determine the magnitude of the signal quanta must be defined with great precision as these will set the static linearity of the D/A converter. Such factors as optimum choice of transistor or resistor size, common centroid layout can be used to optimise this static linearity.

In a switched current sigma delta A/D converter the feedback D/A converter presents its signal output to the input of the first integrator (or possibly differentiator) in the noise shaping filter. Signal summation, i.e. of the input and feedback currents, is achieved by simple connection of wires. In such switched current circuits there is always a settling error due to the time constant formed primarily by the total load capacitance at the summing node and the $g_m$ of the storage MOS transistor. Account is normally taken of this in the design and organisation of the storage cells. Any settling error should ideally be very small in absolute terms as there may be a non-linear relationship between the proportion of the error and the incoming signal. Such a variation of settling error will manifest itself as distortion in the signal.

The most convenient form for a current mode D/A converter is to use current sources (or sinks) comprising appropriately biassed MOS transistors which are selectively switched to a current summing node under the control of the applied digital code. Each of these current sources has its own parasitic capacitance to ground, principally due to the drain-bulk capacitances of the MOS transistors. As a result the total capacitance at the summing node (which also forms the input node of the A/D converter) is a function of the applied digital code. Consequently there is a corresponding variation in the settling time of the first integrator and hence a code dependent settling error in the signal stored. This presents a serious risk of distortion, especially in a design optimised for high sample rates where settling time is traded with acceptable sampling error with some precision.

In an ideal situation the capacitance at the input node should be kept to an absolute minimum but doing so implies the use of very small transistors which bring other trade offs into question, and so this strategy is quite constrained.

SUMMARY OF THE INVENTION

It is an object of the invention to enable the provision of a sigma delta analogue to digital converter in which input signal distortion in the quantisation process is reduced. It is a further object of the invention to enable the provision of a digital to analogue converter in which code dependent errors are reduced.

The invention provides a digital to analogue converter including a plurality of current sources each connected to a common node forming an output of the digital to analogue converter via a respective switch whose state is controlled in accordance with an applied digital code to be converted, the digital to analogue converter further including a corresponding plurality of dummy current sources which produce substantially zero current but which have an associated capacitance substantially equal to that of their corresponding current source, each of the dummy current sources being connected to the common node via further respective switches, the state of each of the further respective switches being controlled in accordance with the logical complement of the applied digital code.

The measures adopted according to the invention provide a D/A converter having a substantially constant capacitance at the summing node irrespective of the digital code to be converted. Thus in a sigma delta A/D converter there will not be any variation in settling error with instantaneous digital code and it becomes possible to optimise the trade-offs in switched current storage cells for a known load capacitance.

In one embodiment all the current sources may have the same value. This arrangement is convenient for multi-bit sigma delta converters since it can operate directly on the thermometer code produced naturally by the quantiser.

Each current source may comprise an MOSFET having its gate electrode connected to a bias potential source. In this case the D/A converter conveniently comprises a plurality of unit sized MOS transistors biassed from a common reference so that a plurality of identical currents may be added to the output via digitally controlled switches.

The dummy current source may comprise a further MOSFET having the same dimensions as the corresponding current source MOSFET, the further MOSFET being biased to be non-conducting.

Providing the dummy current sources in the form of MOSFETS having the same dimensions and characteristics as the current source MOSFETS a closely matched parasitic capacitance is obtained. If they are formed adjacent to the current sources in an integrated circuit then process variations will track thus providing accurate matching of the capacitances.

The invention further provides a sigma-delta analogue to digital converter including such a digital to analogue converter. The A/D converter may be arranged to process differential input currents and include first and second such D/A converters.

When the A/D converter includes a noise shaper using switched current circuits for the signal processing a constant node capacitance is presented to the storage cell input and hence there is no code dependent change in settling time due to changing node capacitance.

BRIEF DESCRIPTION OF THE DRAWINGS

The above and other features and advantages of the invention will be apparent from the following description, by way of example, of an embodiment of the invention with reference to the accompanying drawings, in which.

DESCRIPTION OF THE PREFERRED EMBODIMENTS

Figure 1:
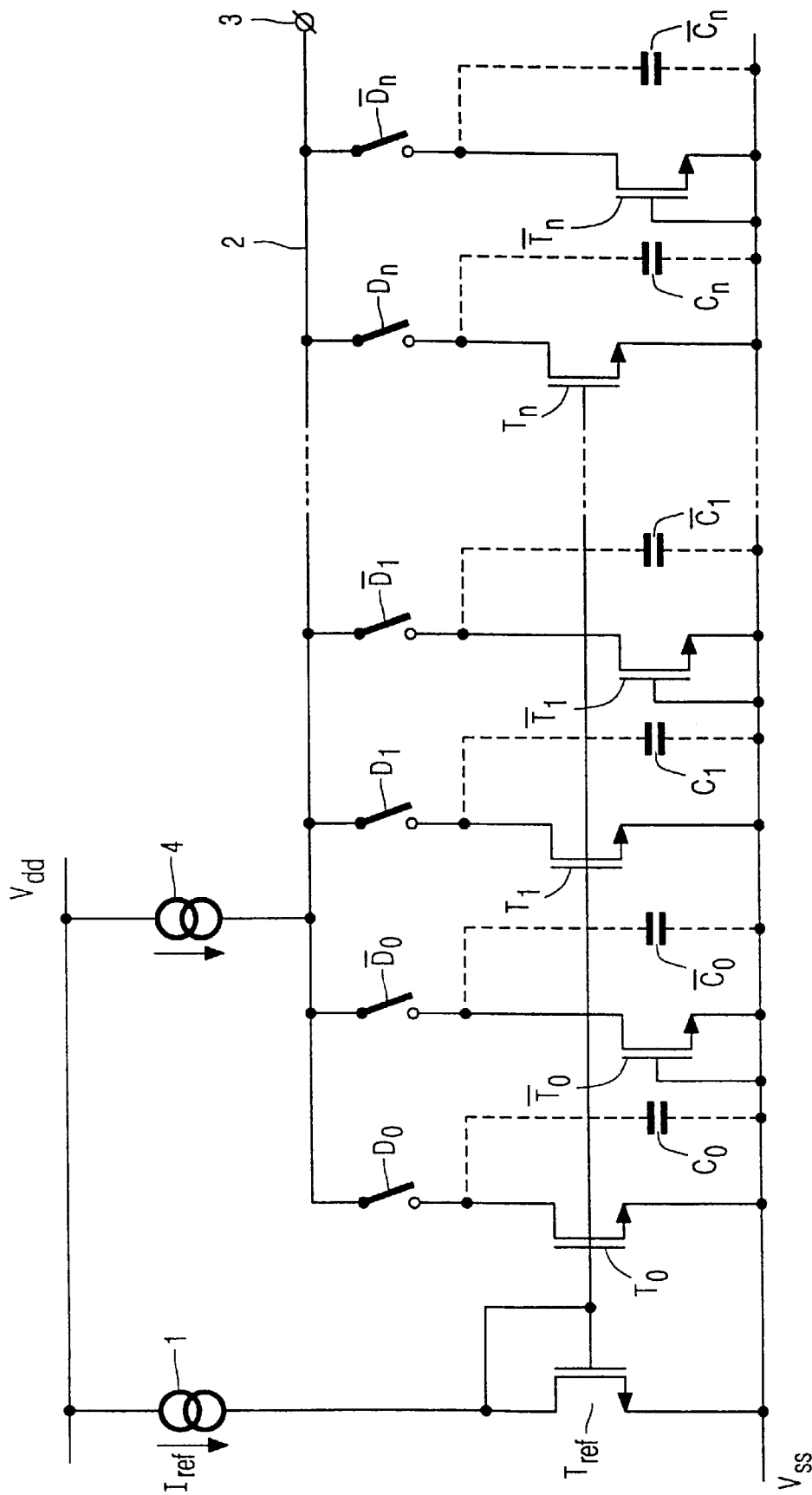
FIG. 1 is a circuit diagram of one embodiment of a digital to analogue converter according to the invention.

FIG. 1 shows in schematic form a digital to analogue converter according to the invention which produces an analogue output current whose value depends upon an applied digital code. The digital to analogue converter is shown in FIG. 1 comprises a current source 1, which supplies a reference current $I_{ref}$ and is connected between a supply rail $V_{dd}$ and the drain and gate electrodes of an N-channel field effect transistor $T_{ref}$. The source electrode of the transistor $T_{ref}$ is connected to a supply rail $V_{ss}$. The gate electrode of transistor $T_{ref}$ is connected to the gate electrodes of a plurality of transistors $T_0, T_1, \ldots T_N$. The source electrodes of transistors $T_0$ to $T_N$ are connected to the supply rail $V_{ss}$, while their drain electrodes are connected via respective switches $D_0, D_1, \ldots D_N$ to a line 2 which is connected to an output 3 of the digital to analogue converter. A further current source 4 is connected between the supply rail $V_{dd}$ and the line 2 to act as a bias and a current offset so that the total output current can be in either direction.

A further plurality of transistors $\overline{T}_O, \overline{T}_I \ldots \overline{T}_N$ have their gate and source electrodes connected to the supply rail $V_{ss}$. The drain electrodes of transistors $\overline{T}_O, \overline{T}_I, \ldots \overline{T}_n$ are connected via respective switches $\overline{D}_O, \overline{D}_I \ldots \overline{D}_N$ to the line 2.

Each of the current sources consisting of transistors $T_o$ to $T_N$ respectively has its own parasitic capacitance to ground $C_O$ to $C_N$ principally due to drain bulk capacitances. If we initially neglect the contribution of transistors $\overline{T}_O, \overline{T}_I \ldots \overline{T}_N$ and switches $\overline{D}_O, \overline{D}_I \ldots \overline{D}_N$ the total capacitance at the output 3 will be an approximately linear function of the digital code. If such an output is connected to the input of a switched current integrator it will cause a consequent variation in the settling time constant of that integrator and hence a code dependent settling error in the signals stored. This presents a serious risk of distortion particularly in a design optimised for very high sample rates where the settling time must be traded for acceptable sampling error with some precision. Consequently the output capacitance at output 3 should ideally be kept to an absolute minimum but this should not take priority over the issues of linearity. Hence a converter in which the output capacitance is constant irrespective of the digital code has advantages since there will then not be any variation in the settling error with the instantaneous digital code and as a result it becomes possible to optimise the trade offs in the switched current storage cells for a known load capacitance.

In order to enable the provision of such a constant output capacitance further transistors $\overline{T}_o$ to $\overline{T}_N$ and switches $\overline{D}_N$ to $\overline{D}_O$ are provided. The transistors $\overline{T}_o$ to $\overline{T}_N$ have associated capacitances $\overline{C}_o$ to $\overline{C}_N$ which are substantially equal to the capacitances $C_o$ to $C_N$. The switches $\overline{D}_o$ to $\overline{D}_N$ are operated by the inverse binary code to that which operates the switches $D_o$ to $D_N$. Thus at any one time the same total capacitance is seen at the output 3. Clearly the transistors $\overline{T}_o$ to $\overline{T}_N$ do not provide any contribution to the current output of the D/A converter as they are non-conducting but their associated capacitances are selectively connected to ensure a constant total capacitance at the output 3.

Figure 2:
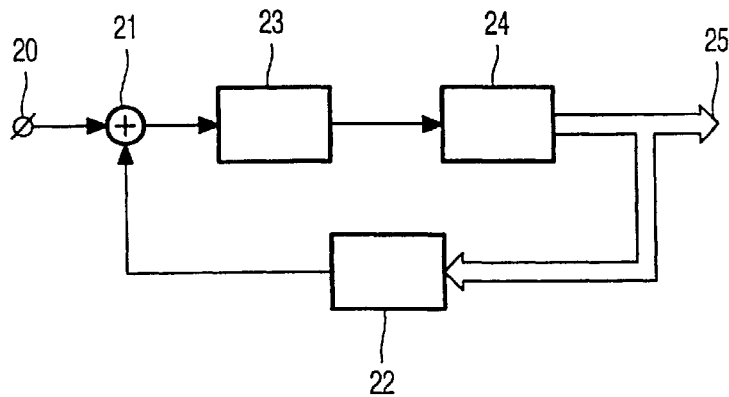
FIG. 2 is a block schematic diagram of one embodiment of an analogue to digital converter according to the invention.

Such a digital to analogue converter may be used in a sigma delta digital to analogue converter arrangement. FIG. 2 shows a sigma delta analogue to digital converter according to the invention. As shown in FIG. 2 the converter has an input 20 to which an input signal is fed and which is connected to the first input of a summing circuit 21. The output of a digital to analogue converter 22 is connected to a second input of the summing circuit 21. The digital to analogue converter 22 takes the form of that shown in FIG. 1. The output of the summing circuit 21 is fed to a noise shaper 23 whose output is fed to a quantiser 24. The output of the quantiser 24 is fed to the input of the digital to analogue converter 22 and as an output digital code to an output 25. The noise shaper 23 may be comprised for example from switched current integrators. As is known, switched current integrators have an input which can sample the output current from the summing circuit 21.

Figure 3:
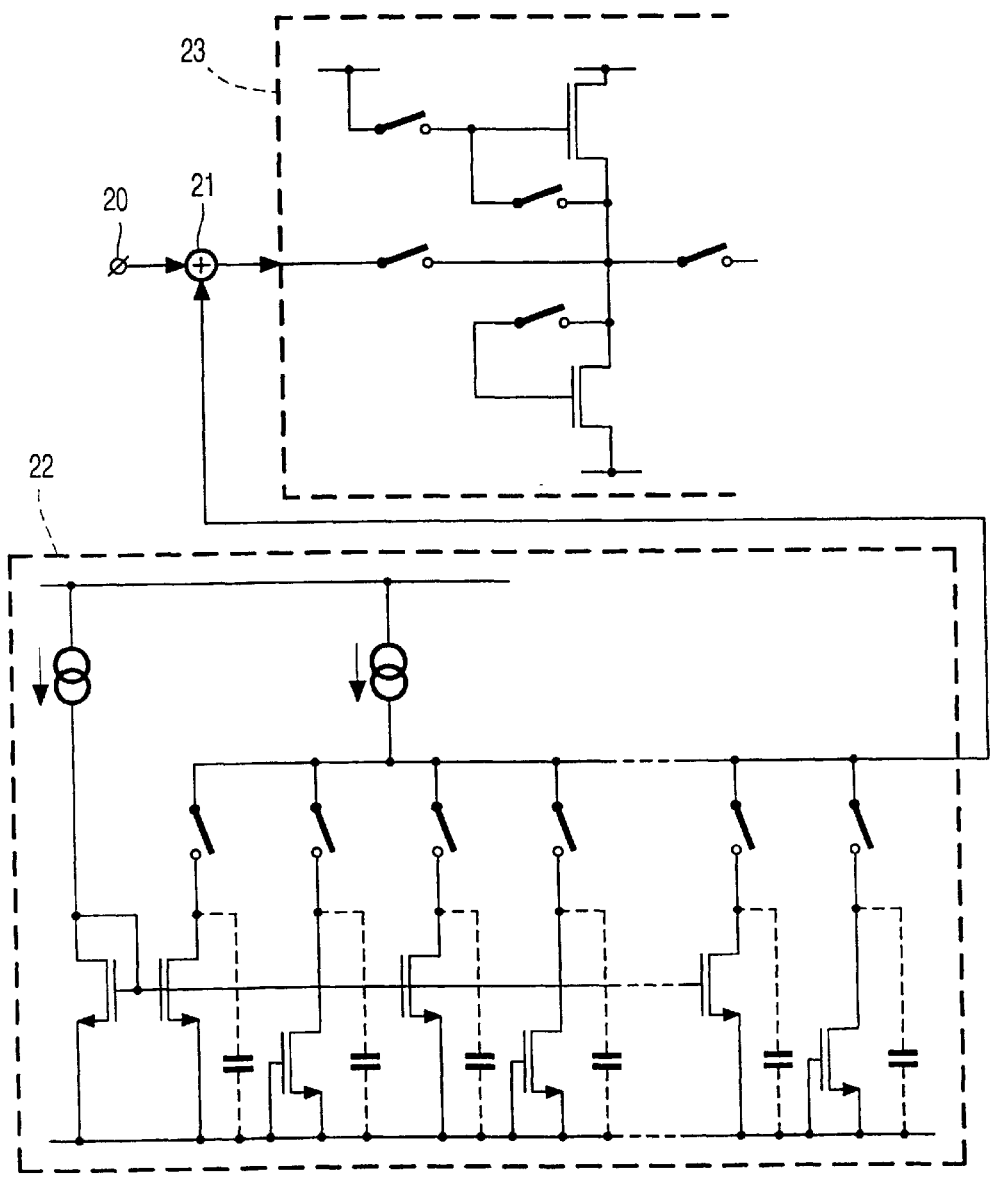
FIG. 3 shows the converter of FIG. 1 connected to an embodiment of a switched current memory cell forming part of an integrator in a noise shaper used in the converter of FIG. 2.

FIG. 3 shows in further detail the interface between the input signal, the output of the digital to analogue converter and the noise shaper. The input 20 is fed to a first input of a current summing node 21 while the output of the digital to analogue converter 22 is fed to a second input of the current summing node 21. The output from the current summing node 21 is fed to the input of the noise shaper 23. As shown in FIG. 3 the input of the noise shaper 23 comprises a switched current memory cell which samples the input during a first phase of a clock signal. The particular type of current memory cell shown as the input circuit of the noise shaper 23 is described in EP-A- 0 608 936.

PHB 33830 and is generally referred to as an S21 current memory cell. When processing input current signals having high frequency components, it is necessary that the clock signal applied to the current memory cells is of an even higher frequency and thus the settling time for the current on to the current memory cell is correspondingly short. Thus it is important that a consistent capacitive load is connected to this input so that a consistent settling time is achieved regardless of the current input magnitude. The current summing network 21 may consist merely of a node to which the input current and the output current of the digital to analogue converter 22 are applied and the current flowing from the node flows into the input of the noise shaper 23.

Various modifications can be made to this arrangement without departing from the scope of the invention. For example, more complex current sources could be used with for example cascoding to increase the output impedance of the current source. In the embodiment shown the current sources can be more strictly regarded as current sinks. The actual current being supplied to the noise shaper being that produced by the current source for minus that sunk by whichever of the current sinks is switched to the line 2 by means of the switches $D_o$ to $D_N$. It would, of course, be possible to invert this circuit so that the switched current sources were composed of P-channel field effect transistors connected to the supply rail $V_{dd}$ with a corresponding current sink 4 comprising an N-channel field effect transistor.

Figure 4:
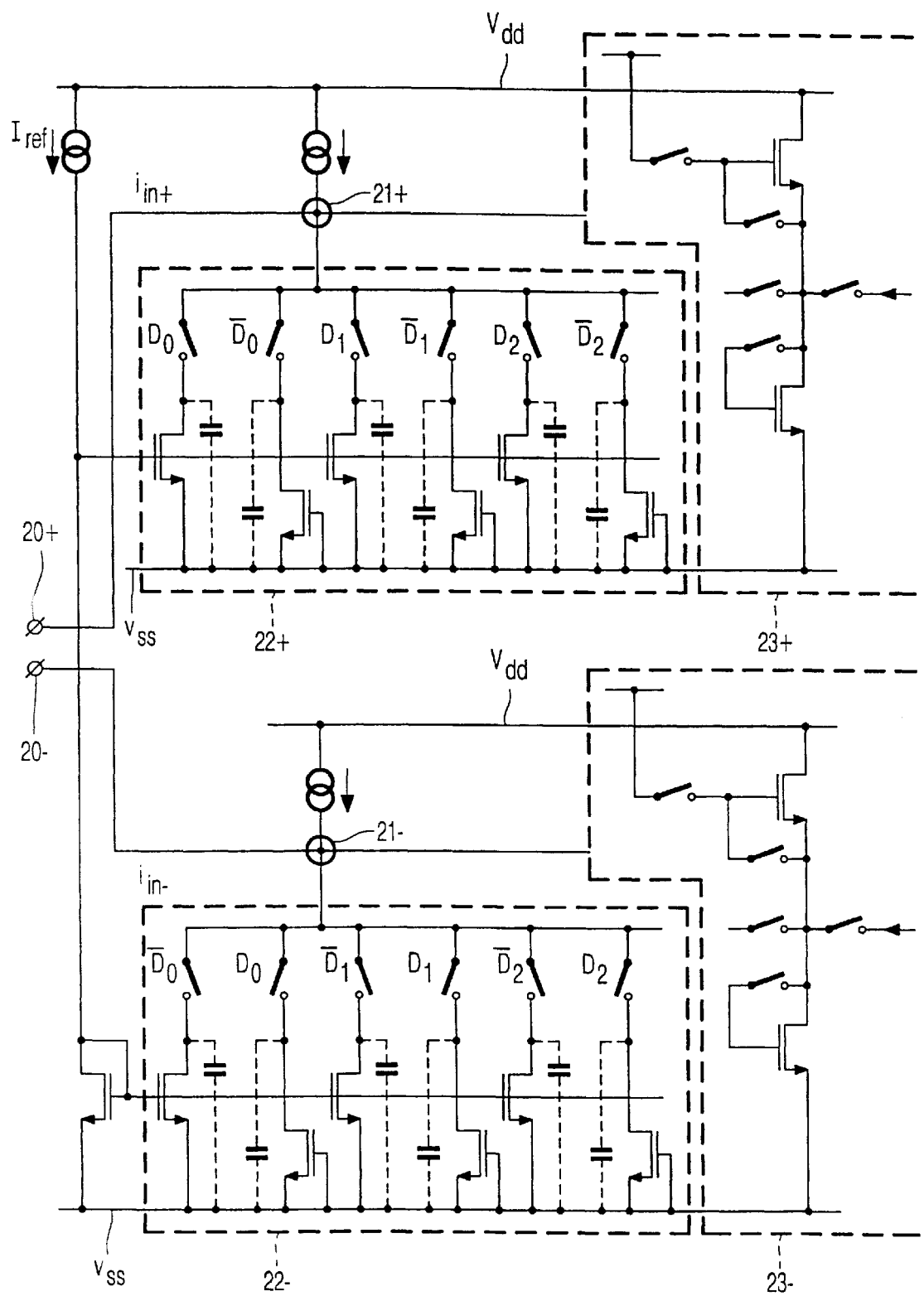
FIG. 4 illustrates an arrangement for converting a differential input current to a digital signal.

It is also possible to produce a differential version of such an analogue to digital converter which would give the known advantages of differential operation in terms of reduction of harmonic distortion. Such a differential version is illustrated in FIG. 4 where a differential analogue current to be converted is applied to inputs 20+ and 20−. Two digital to analogue convertors 22+ and 22−, which in this example are 3 bit convertors, produce the other inputs to the summing circuits 21+ and 21−. The outputs of the summing circuits 21+ and 21−produce current inputs to differential switched current integrator circuits forming the input of the noise shaper 23.

It is not necessary that the noise shaper 23 is constructed using switched current techniques as the response of any transconductance stage will be affected by the capacitance presented at its input.

From reading the present disclosure, other modifications will be apparent to persons skilled in the art. Such modifications may involve other features which are already known in the design and use of analogue to digital or digital to analogue converters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the sames invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A digital to analogue converter including a plurality of current sources each connected to a common node forming an output of the digital to analogue converter via a respective switch whose state is controlled in accordance with an applied digital code to be converted, the digital to analogue converter further including a corresponding plurality of dummy current sources which produce substantially zero current but which have an associated capacitance substantially equal to that of their corresponding current source, each of the dummy current sources being connected to the common node via further respective switches, the state of each of the further respective switches being controlled in accordance with the logical complement of the applied digital code.

2. A digital to analogue converter as claimed in claim 1 in which all the current sources have the same value.

3. A digital to analogue converter as claimed in claim 1 in which each current source comprises an MOSFET having its gate electrode connected to a bias potential source.

4. A digital to analogue converter as claimed in claim 2 in which each current source comprises an MOSFET having its gate electrode connected to a bias potential source.

5. A digital to analogue converter as claimed in claim 3 in which the dummy current source comprises a further MOSFET having the same dimensions as the corresponding current source MOSFET, the further MOSFET being biassed to be non-conductive.

6. A digital to analogue converter as claimed in claim 4 in which the dummy current source comprises a further MOSFET having the same dimensions as the corresponding current source MOSFET, the further MOSFET being biassed to be non-conductive.

7. A sigma-delta analogue to digital converter including a digital to analogue converter comprising a plurality of current sources each connected to a common node forming an output of the digital to analogue converter via a respective switch whose state is controlled in accordance with an applied digital code to be converted, the digital to analogue converter further including a corresponding plurality of dummy current sources which produce substantially zero current but which have an associated capacitance substantially equal to that of their corresponding current source, each of the dummy current sources being connected to the common node via further respective switches, the state of each of the further respective switches being controlled in accordance with the logical complement of the applied digital code.

8. A sigma-delta analogue to digital converter for converting a differential analogue current input including first and second digital to analogue converters, each digital to analogue converter comprising a plurality of current sources each connected to a common node forming an output of the digital to analogue converter via a respective switch whose state is controlled in accordance with an applied digital code to be converted, the digital to analogue converter further including a corresponding plurality of dummy current sources which produce substantially zero current but which have an associated capacitance substantially equal to that of their corresponding current source, each of the dummy current sources being connected to the common node via further respective switches, the state of each of the further respective switches being controlled in accordance with the logical complement of the applied digital code.

* * * * *